US009286946B2

(12) United States Patent
Takayama et al.

(10) Patent No.: US 9,286,946 B2
(45) Date of Patent: Mar. 15, 2016

(54) VOICE RECORDING AND PLAYBACK DEVICE, AND CONTROL METHOD FOR VOICE RECORDING AND PLAYBACK DEVICE

(71) Applicant: Olympus Corporation, Shibuya-ku, Tokyo (JP)

(72) Inventors: Sho Takayama, Koganei (JP); Kazushi Fujitani, Sagamihara (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 14/272,001

(22) Filed: May 7, 2014

(65) Prior Publication Data

US 2014/0337014 A1 Nov. 13, 2014

(30) Foreign Application Priority Data

May 8, 2013 (JP) ................................. 2013-098340

(51) Int. Cl.
| | |
|---|---|
| G10L 19/00 | (2013.01) |
| G11B 27/34 | (2006.01) |
| G11B 27/031 | (2006.01) |
| G11B 27/32 | (2006.01) |
| G11C 7/16 | (2006.01) |

(52) U.S. Cl.
CPC .............. *G11B 27/34* (2013.01); *G11B 27/031* (2013.01); *G11B 27/327* (2013.01); *G11C 7/16* (2013.01); *G11C 2207/16* (2013.01)

(58) Field of Classification Search
USPC ........................................................ 704/201
See application file for complete search history.

(56) References Cited

U.S. PATENT DOCUMENTS

| | | | | |
|---|---|---|---|---|
| 5,944,633 | A | * | 8/1999 | Wittrock ............................ 482/4 |
| 8,015,500 | B2 | | 9/2011 | Mita |
| 2008/0159491 | A1 | * | 7/2008 | Kelley et al. ................ 379/88.16 |
| 2008/0215990 | A1 | * | 9/2008 | Sellen et al. .................... 715/751 |
| 2010/0054498 | A1 | * | 3/2010 | Sollenberger et al. ........ 381/104 |

OTHER PUBLICATIONS

PJ-25 product promotion, Olympus Imaging Ltd., search date, Apr. 24, 2013 at http://olympus-imaging.jp/product/audio/pj25/index.html), 3 pages.
PJ-25 user manual, Olympus Imaging Ltd., search date, Apr. 24, 2013 at http://support.olypus.co.jp/jp/support/dlc/archive/man_pj25.pdf), 136 pages.

* cited by examiner

*Primary Examiner* — Vu B Hang
(74) *Attorney, Agent, or Firm* — John C. Pokotylo; Straub & Pokotylo

(57) ABSTRACT

A voice recording and playback device of the present invention is capable of storage management of generated voice data, to which date information has been attached, as voice files, and comprises a display section capable of calendar display, and a control section for, at the time of retrieving voice files from a storage section, performing movable identification on a calendar display, as well as retrieving voice files that have been stored in the storage section based on date information attached to the files, and performing display of results of this retrieval indicating the existence of voice files close to day display on the calendar display, wherein the control section moves the identification position based on an instruction operation by the retrieval instructions section, and generates a notification in accordance with voice files that exist on the date of the identification position that has been moved.

6 Claims, 7 Drawing Sheets

FIG. 7

| NON-VISUAL NOTIFICATION FORMAT | RELATIONSHIP BETWEEN VOICE DATA AND CURSOR POSITION | NOTIFICATION USING VOICE | NOTIFICATION USING VIBRATION |
|---|---|---|---|
| NOTIFICATION FORMAT 1 | NO NORMAL RECORDING FILE<br>NO MEMO RECORDING FILE<br>CURSOR POSITION MOVING IN DIRECTION TO MOVE DATE FORWARD | BEEP1 1.5kHz, 30ms | VIBRATION PATTERN 1 |
| NOTIFICATION FORMAT 2 | NO NORMAL RECORDING FILE<br>NO MEMO RECORDING FILE<br>CURSOR POSITION MOVING IN DIRECTION TO MOVE DATE BACKWARD | BEEP2 0.5kHz, 30ms | VIBRATION PATTERN 2 |
| NOTIFICATION FORMAT 3 | NORMAL RECORDING FILE<br>NO MEMO RECORDING FILE | BEEP3 2.0kHz, 30ms | VIBRATION PATTERN 3 |
| NOTIFICATION FORMAT 4 | NO NORMAL RECORDING FILE<br>MEMO RECORDING FILE | BEEP4 1.0kHz, 30ms | VIBRATION PATTERN 4 |
| NOTIFICATION FORMAT 5 | NORMAL RECORDING FILE<br>MEMO RECORDING FILE | BEEP5 2.0kHz, 30ms, 30ms | VIBRATION PATTERN 5 |

VOICE RECORDING AND PLAYBACK DEVICE, AND CONTROL METHOD FOR VOICE RECORDING AND PLAYBACK DEVICE

Benefit is claimed, under 35 U.S.C. §119, to the filing date of prior Japanese Patent Application No. 2013-098340 filed on May 8, 2013. This application is expressly incorporated herein by reference. The scope of the present invention is not limited to any requirements of the specific embodiments described in the application.

BACKGROUND OF THE INVENTION

1. Field of the Invention

The present invention relates to a voice recording and playback device that is capable of retrieving voice files that have been stored in a storage section, and to a control method therefore.

2. Description of the Related Art

An IC recorder is generally known as a voice recording and playback device. An IC recorder converts recorded data that has been generated in accordance with a recording operation, to a specified voice file, and stores this voice file in a memory that is built in to the IC recorder or a memory card that can be removed from the IC recorder. At the time of playing back the voice file, the user selects the voice file they want and performs voice playback. If the recording operation is repeated, there will be many voice files stored in the memory, and it takes time for the user to locate the desired voice file.

In order to simplify a voice file retrieval operation, a method that uses calendar display is known. For example, with the IC recorder manufactured by Olympus Imaging disclosed in non-patent publication 1 below (PJ-25), it is possible to carry out a retrieval method that uses calendar display (calendar retrieval), and the retrieval method using calendar retrieval is described on page 56 of the user manual disclosed in non-patent publication 2 below. With this calendar retrieval, a calendar is displayed in month units, and if a voice file exists relating to a date in the selected month, a mark indicating that a voice file exists is displayed close to the display date (a numeral representing the day). Also, when performing data retrieval, such as image data, a date is specified and an image file is searched for on a calendar format retrieval screen having a matrix structure (for example, refer to U.S. Pat. No. 8,015,500).

Non-patent literature 1: PJ-25 product promotion, [online], Olympus Imaging Ltd., [Search date, Apr. 24, 2013], Internet (URL:http://olympus-imaging.jp/product/audio/pj25/index.html)

Non-patent literature 2: PJ-25 user manual, [online], Olympus Imaging Ltd., [Search date, Apr. 24, 2013], Internet (URL:https://support.olympus.co.jp/jp/support/dlc/archive/man_pj25.pdf)

SUMMARY OF THE INVENTION

An object of the present invention is to provide a voice recording and playback device that has good usability and is highly convenient with regard to voice file retrieval, and a control method for this device.

A voice recording and playback device of the present invention is capable of storage management of generated voice data, to which date information has been attached, as voice files, and comprises a storage section for storing the voice files, a display section capable of calendar display, a retrieval instruction section for instructing retrieval of voice files that have been stored in the storage section from the calendar, and a control section for, at the time of retrieving voice files from the storage section, performing movable identification on the calendar display, as well as retrieving voice files that have been stored in the storage section based on date information attached to the files, and performing display of results of this retrieval indicating the existence of voice files close to day display on the calendar display, wherein the control section moves the identification position based on an instruction operation by the retrieval instruction section, and generates a notification in accordance with voice files that exist on the date of the identification position that has been moved.

A voice recording a playback method of the present invention is capable of managing storage of generated voice data as voice files to which date information has been attached, and is a control method for a voice playback device that comprises a storage section for storing the voice files, a display section capable of calendar display, and a retrieval instruction section for instructing retrieval of voice files that have been stored in the storage section from the calendar, the method comprising: a step of, at the time of retrieving voice files from the storage section, performing movable identification on the calendar display, as well as retrieving voice files that have been stored in the storage section based on date information attached to the files, and performing display of results of this retrieval indicating the existence of voice files close to day display on the calendar display; and a step of moving the identification position based on an instruction operation by the retrieval instruction section, and generating a notification in accordance with voice files that exist on the date of the identification position that has been moved.

BRIEF DESCRIPTION OF THE DRAWINGS

FIG. 7 is a table showing notification operations using voice and vibration, for the IC recorder of the one embodiment of the present invention.

DETAILED DESCRIPTION OF THE PREFERRED EMBODIMENTS

Figure 1:
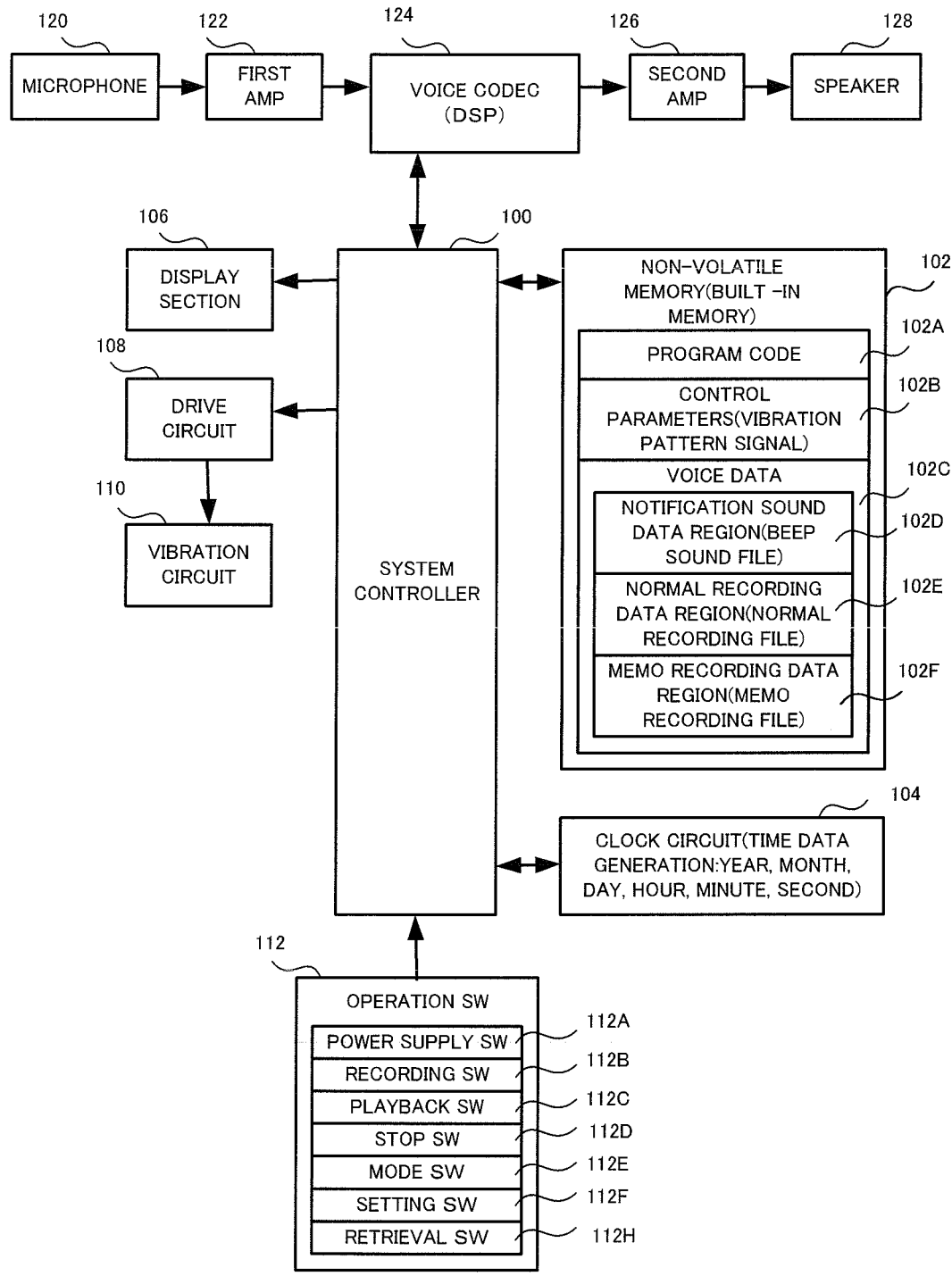
FIG. 1 is a block diagram mainly showing the electrical structure of an IC recorder of one embodiment of the present invention.

Preferred embodiments using IC recorder to which the present invention has been applied will be described in the following in accordance with the drawings. FIG. 1 is a block diagram mainly showing the electrical structure of an IC recorder of one embodiment of the present invention. This IC recorder stores voice data as voice files in a semiconductor memory, and is also capable of memory management by attaching date information to the voice files, and performing playback by reading out the voice files.

A microphone 120 converts voice to analog voice signals, and outputs to a first amplifier (hereafter abbreviated to AMP) 122. The first AMP 122 amplifies the analog voice signals, and outputs to a voice codec 124 which will perform digital signal processing. The voice codec 124 converts input analog voice signals to a specified digital format voice file, and outputs to a system controller 100.

The voice codec 124 converts a voice file that has been read out by the system controller 100 to analog voice signals, and outputs to a second amplifier (AMP) 126. The second AMP 126 amplifies the analog voice signals that have been output from the voice codec 124, and outputs to a speaker 128. The speaker 128 converts the analog voice signals to voice. Also, as will be described later using FIG. 7, at the time of calendar retrieval, five types of voice notification are carried out in accordance with a notification signal, accompanying operation of an operating member within an operation switch (hereafter abbreviated to operation SW) 112.

The system controller 100 includes elements such as a CPU, and carries out overall control of the IC recorder in accordance with programs stored in a nonvolatile memory 102. Specifically, various operations such as recording, playback and retrieval, etc. are carried out in accordance with operation of various operation members within the operating switch (hereafter abbreviated to SW) 112. As well as the aforementioned voice codec 124, a display section 106, drive circuit 108, operating SW 112, nonvolatile memory 102 and clock circuit 104 are connected to the system controller 100.

The display section 106 has an LCD, etc., display panel, is input with display control signals from the system controller 100, and displays a calendar display etc. on an operating screen. The drive circuit 108 is input with vibration control signals from the system controller 100 and sets up vibration in a vibration element 110. If the vibration element 110 vibrates, the whole of the IC recorder will vibrate. As the vibration element 110 it is possible to use a vibrating motor, etc. that produces vibration by rotation of an eccentric weight by a motor. As will be described later using FIG. 7, with this embodiment vibration using five vibration patterns is possible.

The operating SW 112 has a plurality of operating members for carrying out various operations of the IC recorder, such as recording, playback, retrieval etc. A power supply SW 112A instructs starting or stopping of the IC recorder, a record SW 112B instructs commencement of a recording operation, a playback SW 112C instructs commencement of a playback operation, and a stop SW 112D instructs stopping of a recording operation or playback operation.

A mode SW 112E instructs mode selection such as retrieval mode, a setting SW 112F instructs update of settings for display method, and a retrieval SW 112H is used at the time of a retrieval operation. The retrieval SW 112H includes a DUp SW for counting up day data, a DDown SW for counting down day data, an MUp SW for counting up month data, and an MDown SW for counting down month data. It is also possible to provide other operation SWs besides these. It is also possible to allocate a plurality of functions to a single switch.

The clock circuit 104 generates time data, including year, month, day, hours, minutes, and seconds, and outputs to the system controller 100. The system controller 100 performs display of a calendar on the display section 106 based on this time data.

The nonvolatile memory 102 is an electrically rewritable memory, such as flash ROM, and is built into the IC recorder. The nonvolatile memory 102 stores program code 102A, control parameters 102B, and voice data 102C. The program code 102A is a program for causing operation of the system controller 100, as described above. The control parameters 102B are parameters associated with operation of the IC recorder, such as operating mode, voice storage conditions, vibration pattern etc. As vibration patterns five patterns are stored (refer to FIG. 7).

Voice data 102C includes a beep sound file, a normal recording file, and a memo recording file. As storage regions for voice data there are a notification sound data region 102D storing a beep sound file, a normal recording data region 102E storing a normal recording file, and a memo recording data region 102F storing a memo recording file. With this embodiment, five beeps sounds are stored as beep sound files (refer to FIG. 7). Also, a normal recording file is a recording file that has been processed by a voice codec, based on audio signals gathered by the microphone 120, from the time of operation of the record SW 112B until the time of operation of the stop SW 112D.

A memo recording files stored in the memo recording data region 102E is for the purpose of allowing the user to record an appointment corresponding to a specified date, for example a function, a performance, a plan of action, or an event etc. as a voice message. In order to associate this specified date and the voice message, rules are stipulated for method of generating the name of the memo recording file. Specifically, at the time of generating the memo recording file, character information for the date information (specified date desired by the user) is attached to part or all of character information for the name of the memo recording file (regarding memo recording, refer to S222 and S224 in FIG. 3, will be described later). With a memo recording file retrieval operation, date information contained within the file name is the object of retrieval (regarding the memo recording file retrieval operation, refer to S204 and S208 in FIG. 3, and FIG. 4 and FIG. 5, which will be described later).

With this embodiment, voice data is stored in the nonvolatile memory within the IC recorder. However, if a memory card that can be inserted into and removed from the IC recorder exists, the voice data may also be stored in this memory card.

Next, operation of the IC recorder of this embodiment will be described using the flowcharts shown in FIG. 2-FIG. 5. As described previously, these flowcharts are executed by the system controller 100 reading out the program code 102A in the nonvolatile memory 102, and controlling each section within the IC recorder in accordance with this program code 102A.

Figure 2:
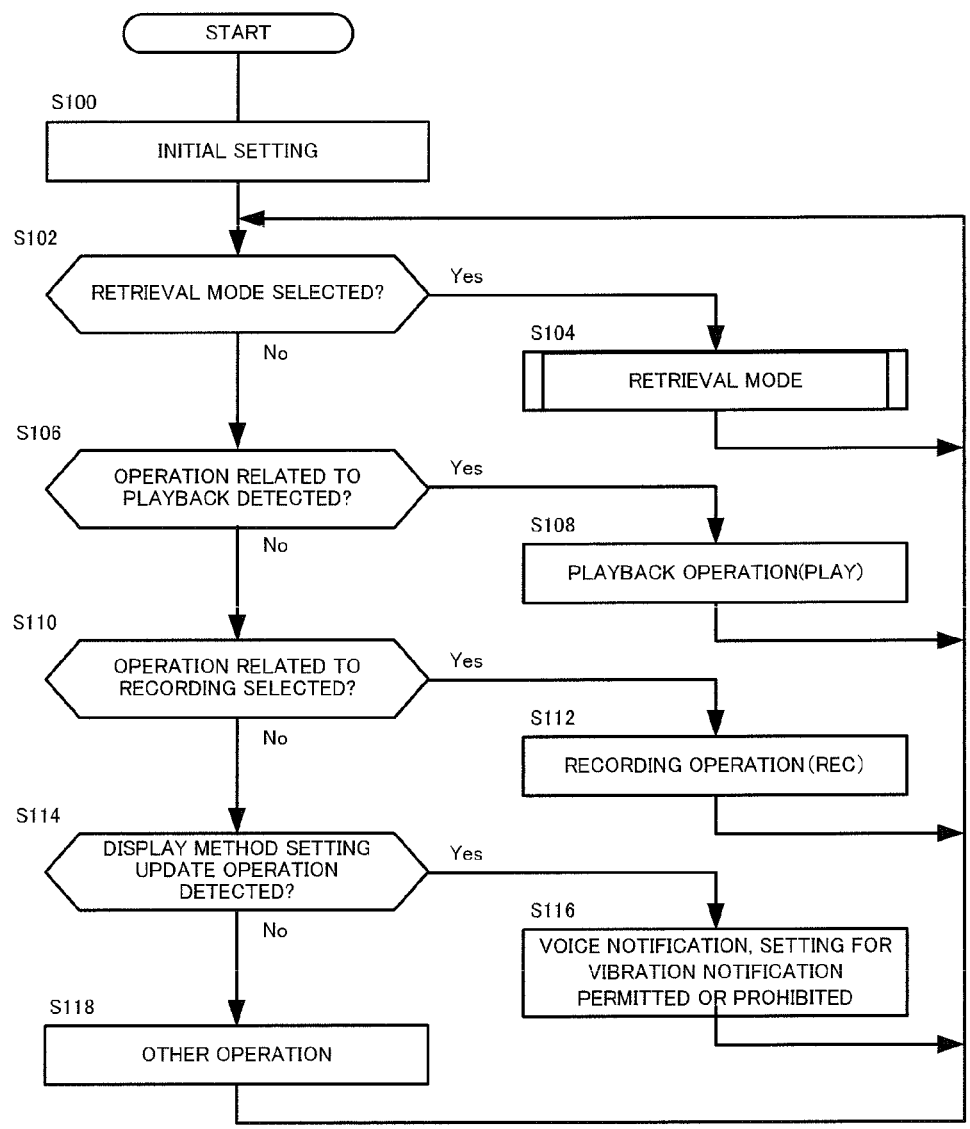
FIG. 2 is a flowchart showing overall operation of the IC recorder of the one embodiment of the present invention.

FIG. 2 shows the main flow, and operation commences if the power supply SW 112A is operated. First, initial setting is carried out (S100). In this step, information relating to operating conditions that has been set as control parameters 102B is read out from the nonvolatile memory 102. This information includes a codec method when storing voice data, voice sampling conditions, indication format etc. As information relating to indication format, there is information representing whether or not to carryout a notification operation using voice (or notification operation using vibration) in accordance with whether or not there is a voice file at the time of a voice file retrieval operation, which will be described later (refer to FIG. 7).

Once initial setting has been carried out it is next determined whether or not retrieval mode has been selected (S102). In this step, the system controller 100 detects operating state of the mode SW 112E within the operating SW 112, and determines whether or not an operation has been carried out to instruct a retrieval operation for voice files.

Figure 6:
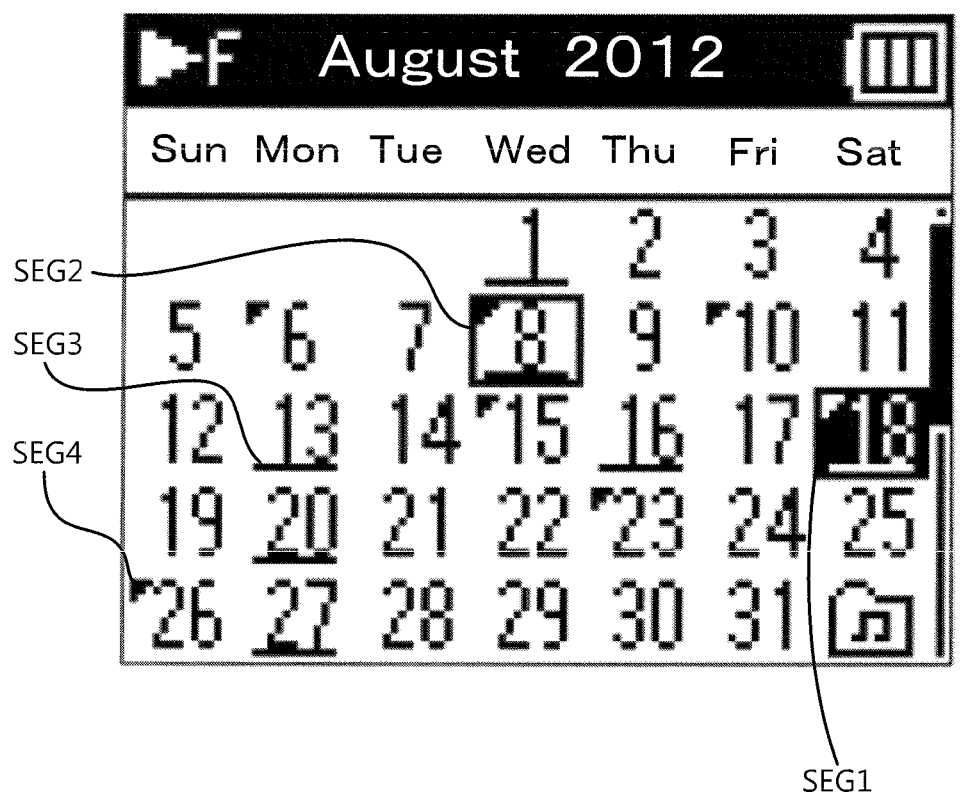
FIG. 6 is a plan view showing calendar display of the IC recorder of the one embodiment of the present invention.

If the result of determination in step S102 is that retrieval mode has been selected, retrieval mode is executed (S104). In this subroutine, the voice file retrieval operation and the results of retrieval are displayed using calendar display. Specifically, with this subroutine calendar display such as is shown in FIG. 6 is carried out, and if a day represented by a cursor is moved in response to operation of the retrieval SW 112H, any normal recordings or memo recordings being stored for around the day that has been indicated are retrieved. When the user carries out a memo recording also, it is carried out in this retrieval mode. Detailed operation of this retrieval mode will be described later using FIG. 3. Once retrieval mode has been executed processing returns to step S102.

If the result of determination in step S102 was that retrieval mode was not selected, operation relating to playback is detected (S106). In this step, the system controller 100 detects operating state of the playback SW 112C within the operating SW 112, and determines whether or not an operation has been carried out to instruct a playback operation for a voice file.

If the result of determination in step S106 is that operation related to playback has been detected, a playback operation (PLAY) is executed (S108). Here, a selected voice file is read out from the normal recording data region 102E or the memo recording data region 102F within the nonvolatile memory 102, and a playback operation is carried out by the voice codec 124, second AMP 126, and speaker 128. Once the playback operation has been carried out, processing returns to step S102.

If the result of determination in step S106 was that an operation relating to playback was not detected, then next, operation relating to recording is detected (S110). In this step, the system controller 100 detects operating state of the record SW 112B within the operating SW 112, and determines whether or not an operation has been carried out to instruct a recording operation.

If the result of determination in step S110 was that's an operation relating to recording was detected, a recording operation (REC) is executed (S112). Here, the system controller 100 stores a voice file that has been input via the first AMP 122 and the voice codec 124 into the normal recording data region 102E within the nonvolatile memory 102. The system controller 100 generates a file by attaching date information that has been acquired from the clock circuit 104 to the voice file as a property. Once the recording operation has been carried out, processing returns to step S102.

If the result of determination in step S110 is that an operation relating to recording has not been detected, an indication method setting update operation is detected (S114). In this step, the system controller 100 determines whether or not operation of the setting SW 112F has been carried out. A setting operation for indication method involves changing voice notification control information representing whether voice notification is allowed or prohibited during a calendar display operation, or vibration notification control information representing whether the vibration notification is allowed or prohibited during a calendar display operation, in response to operation of the setting SW 112F.

If the result of determination in step S114 is that a change operation for indication method setting has been carried out, allowing or prohibiting voice notification or vibration notification is set (S116). In this step, the system controller 100 stores control parameters corresponding to the change operation that was detected in step S114 in the control parameters 102B. Once allowing or prohibiting voice notification or vibration notification has been set, processing returns to step S102.

If the result of determination in step S114 is that the change operation for indication method setting has not been detected, other operations are carried out (S118). Here, operations other than the above-described steps S104, S108, S112 and S116 are executed. As other operations there are, for example, deletion or editing of a recorded voice file, or setting of recording conditions etc. Once other operations have been carried out, processing returns to step S102.

In this way, with the main flow of this embodiment, various operations such as execution of retrieval mode (S104), setting to allow or prohibit voice notification or vibration notification (S116) etc. are executed in accordance with operation of the operating SW 112.

Detailed operation of the retrieval mode of step S104 will next be described using FIG. 3. If retrieval mode is entered, initial operation for retrieval is executed (S200). In the initial operation, the system controller 100 carries out a voice file retrieval operation, and displays a calendar on the display section 106 based on the current date.

FIG. 6 shows one example of a calendar displayed on the display section 106 in step S200. With this embodiment, a calendar for the month for the current date is displayed, and with the example shown in FIG. 6 a current date of Aug. 18, 2012, is shown. Display format for numerals (1, 2, 3, . . . 31) representing day display on the calendar will be described. A numeral SEG1 representing the current date uses a display format that is different from numerals representing other dates (with the example shown in FIG. 6, inverted black and white display). A cursor SEG2 that is moved in response to switch operation by the user is represented by a box surrounding a numeral.

An initial value position for the cursor is set to a display position of a numeral representing the current date (Aug. 18, 2012). Then, if a voice file exists associated with the numeral representing the date to which the cursor has been moved in accordance with SW operation by the user from the initial position (The example shown in FIG. 6 shows the cursor moving from the 18th to the 8th.), a mark representing the existence of a voice file is displayed close to where the numeral is displayed. For example, an underline mark displayed underneath the numeral (SEG3 displayed close to 13) represents that a normal recording file for Aug. 13, 2012, exists. Retrieval of a normal recording file is carried out based on date information that is attached as attribute information of the file (date the file was created).

For example, a triangular mark displayed at the upper left of the numeral (SEG4 displayed close to 26) represents that a memo recording file corresponding to Aug. 23, 2012, exists. Retrieval of a memo recording file is carried out based on date information that is included in the file name. For example, a user generates a memo recording file for the purpose of leaving an appointment corresponding to Aug. 26, 2012, as a voice message. Accordingly, what the user wants to know is a correspondence relationship between the appointment day and the memo recording file. Retrieving a file based on date information for when the memo recording file was created (file attribute information) is also meaningless.

There may also be situations where a normal recording file and a memo recording file exist for the same date. For Aug. 18, 2012, a triangular mark and an underline mark are displayed, indicating that a normal recording file and a memo recording file exist.

Once initial operation for retrieval has been carried out in step S200, it is next determined whether or not an operation to move day information forward has been detected (S202). Here, the system controller 100 determines whether or not there has been operation of the DUp SW, which is one retrieval SW 112H.

If the result of determination in step S202 is that an operation to move the day information forward has been detected, the day information is counted up (S204). With this subroutine, a date denoted by the cursor SEG2 is advanced (moved forward in time) in response to operation of the DUp SW. Detailed operation of this day information count up subroutine will be described later using FIG. 4. Once the day information has been counted up, processing returns to step S202.

If the result of determination in step S202 is that an operation to advance the day information was not detected, it is next determined whether or not an operation to move the day information back has been detected (S206). Here, the system controller 100 determines whether or not there has been operation of the DDown SW, which is one retrieval SW 112H.

If the result of determination in step S206 is that an operation to remove the day information back has been detected, the day information is counted down (S208). With this subroutine, a date denoted by the cursor SEG2 is moved back (moved backward in time) in response to operation of the DDown SW. Detailed operation of this day information count down subroutine will be described later using FIG. 4. Once the day information has been counted down, processing returns to step S202.

If the result of determination in step S206 is that an operation to move the day information backwards was not detected, it is next determined whether or not an operation to fast-forward the day information has been detected (S210). Here, the system controller 100 determines whether or not there has been operation of the MUp SW, which is one retrieval SW 112H.

If the result of determination in step S210 is that an operation to fast-forward the day information been detected, the month information is counted up (S212). In this step, the month of the calendar display is advanced in response to operation of the MUP SW (moved in the direction of a month in the future). For example, if August is currently displayed, September will be displayed, and if operation is performed for a specified time or longer the calendar display will change to show months advancing towards the future, i.e. October, November . . . . Once the month information has been counted up, processing returns to step S202.

If the result of determination in step S210 is that an operation to fast-forward the day information was not detected, it is next determined whether or not an operation to rewind the day information has been detected (S214). Here, the system controller 100 determines whether or not there has been operation of the MDown SW, which is one retrieval SW 112H.

If the result of determination in step S206 is that an operation to rewind the day information has been detected, the month information is counted down (S216). In this step, the month of the calendar display is moved backwards in response to operation of the MDown SW (moved in the direction of a month in the past). For example, if August is currently displayed, July will be displayed, and if operation is performed for a specified time or longer the calendar display will change to show months advancing towards the past, i.e. June, May . . . . Once the month information has been counted down, processing returns to step S202.

If the result of determination in step S214 is that an operation to rewind the day information was not detected, it is next determined whether or not an operation relating to playback has been detected (S218). In this step, the system controller 100 determines whether or not operation of the playback SW 112C has been carried out.

If the result of determination in step S218 is that an operation relating to playback has been detected, a voice file indicated by the cursor position is played back (S220). In this step, if a voice file associated with the date shown by the position of the cursor SEG2 exists, that voice file is played back. At this time, for example, if the playback SW has been operated despite the fact that a voice file does not exist, the user is notified by carrying out a warning display. There is also the possibility that plural files will exist (in the example shown in FIG. 6, a normal recording file and a memo recording file exist for Aug. 8, 2012). At such a time, a selection screen (not shown) is displayed on the display section 106. One file is then selected in response to operation of a specified selection SW (not shown). Once step S220 has been executed, processing returns to step S202.

If the result of determination in step S218 is that an operation relating to playback is not detected, it is next determined whether or not an operation relating to memo recording has been detected (S222). In this step, the system controller 100 determines whether or not operation of the record SW 112B has been carried out.

If the result of determination in step S222 is that an operation relating to memo recording has been detected, a message is recorded and a memo recording file is stored in a specified folder (S224). In this step, the user can record a message that has been associated with a specified date. This specified date is the date shown by the cursor SEG2 on the calendar (with the example shown in FIG. 6, the cursor exists on Aug. 8, 2012). If operation of the stop SW 112D is detected, the message recording operation is completed, and a memo recording file relating to the message is stored in a specified folder of the nonvolatile memory 102 (memo recording data region 102F). The name of this stored file includes date information. Specifically, text information for date information (with the example shown in FIG. 6, Aug. 8, 2012) is included within text information representing the file name. Once the memo recording file has been stored in step S224, processing returns to step S202.

If the result of determination in step S222 is that operation relating to memo recording was not detected, a retrieval operation exit operation is detected. In this step, the system controller 100 determines whether or not operation of the mode SW 112E and retrieval mode has been canceled.

If the result of determination in step S226 is that a retrieval operation exit operation is not detected, processing returns to step S201. On the other hand, if a retrieval operation exit operation is detected, a retrieval exit operation is carried out (S228). Here, calendar display on the display section 106 is stopped, operation in the retrieval mode is terminated, and the original processing flow is returned to.

In this embodiment, in order to manage memo recording files, text information for date information is included within text information of the file name. Also, memo recording files are stored in regions that are different from the regions in which normal recording files are stored (different folders). However, the memo recording file management system is not limited to the above-described management system. For example, it is also possible to manage memo recording files using a management file (database). This management file stores a list in which date information and memo recording file names are associated with each other. Memo recording files are managed on the basis of this list. At the time of creating a new memo recording file, or at the time of deleting an already existing a memo recording file, the management file list is updated. At the time of memo recording file retrieval this list may be searched.

Next, detailed operation a subroutine for the day information count-up of step S204 and the day information count-down in step S208 will be described using the flowchart shown in FIG. 4. In a case of advancing one day ahead from the current position of the cursor SEG2 in response to operation of the DUp SW by the user, a subroutine "day information count up" is called, while in a case of moving one day backwards from the current position of the cursor SEG2 in response to operation of the DDown SW by the user, a subroutine "day information count down" is called.

If the subroutine "day information count up" is called, the cursor position is advanced one day ahead (S300). In this step, the system controller 100 increments a counter representing the position of the cursor SEG2 (adds 1 to a counter value), and moves the position of the cursor SEG2 on the calendar (with the example shown in FIG. 6, moves the cursor from "8" to "9"). When the subroutine "day information count up" is called in a state where the cursor SEG2 is positioned on the final day of the month ("31" in the example shown in FIG. 6), the calendar is updated to display the next month (with the example shown in FIG. 6, "August 2012" is changed to "September 2012"). The cursor SEG2 is moved to the first day of the updated month.

If the subroutine "day information count down" is called, the cursor position is moved one day backwards (S302). In this step, the system controller 100 decrements the counter representing the position of the cursor SEG2 (subtracts 1 from a counter value), and moves the position of the cursor SEG2 on the calendar (with the example shown in FIG. 6, moves the cursor SEG2 from "8" to "7"). When the subroutine "day information count down" is called in a state where the cursor SEG2 is positioned on the first day of the month ("1" in the example shown in FIG. 6), the calendar is updated to display the previous month (with the example shown in FIG. 6, "August 2012" is changed to "July 2012"). The cursor SEG2 is moved to the last day of the updated month.

Once the cursor position has been moved in step S300 or S302, it is next determined whether or not a voice notification operation is permitted (S304). Whether voice notification/vibration notification are permitted or prohibited is stored in the control parameters 102B within the nonvolatile memory 102, and in this step whether or not the voice notification operation is permitted is determined based on stored content of the control parameters 102B If the result of determination in step S304 is that voice notification operation is permitted, a beep sound playback operation is executed (S306). With this subroutine, a beep sound that has been designated by the user is played back based on stored content of the control parameters 102B. Detailed operation of the beep sound playback operation will be described later using FIG. 5. Once the beep sound playback has been carried out, the originating processing flow is returned to.

If the result of determination in step S304 is that a voice notification operation is not permitted, it is next determined whether or not a vibration notification operation is permitted (S308). In this step, whether or not a vibration notification operation is permitted is determined based on stored content of the control parameters 102B.

If the result of determination in step S308 is that vibration notification operation is permitted, a vibration operation is executed (S310). With this subroutine, vibration drive in a vibration pattern that has been designated by the user is carried out based on stored content of the control parameters 102B. Detailed operation of the vibration operation will be described later using FIG. 5. Once the vibration operation has been carried out, the originating processing flow is returned to.

Next, detailed operation of a subroutine for the beep playback operation of step S306 and the vibration operation of step S310 will be described using the flowchart shown in FIG. 5. When a non-visual display operation (notification operation) corresponding to a visual display operation (notification operation) has been permitted as a display operation (notification operation) to the user, the subroutine "playback operation" or subroutine "vibration operation" is executed. The two subroutines differ in that one is for notification to the user using voice and the other is notification to the user using vibration, but the software structure does not differ, and so the two subroutines will be described using a single flowchart. The beep sound playback operation will be mainly described, with the vibration operation being mentioned in parentheses.

If the beep sound playback operation or vibration operation subroutine is entered, a check is performed to see if there is voice data for a normal recording file or a memo recording file corresponding to the cursor position (S400). In this step, the system controller 100 determines whether or not voice data having date information corresponding to the position of the cursor SEG2 exists within the normal recording data region 102E or the memo recording data region 102F.

Once the check as to whether or not there is voice data corresponding to the cursor position has been carried out in step S400, it is next determined whether or not both a normal recording file and a memo recording file exist (S402). Here, determination is based on the result of the check in step S400.

If the result of the determination in step S402 is that both a normal recording of a memo recording exist, a beep 5 is played back (or in the case of a vibration operation, a vibration pattern 5 is driven) (S404). Since a beep sound file for the beep 5 is stored in a notification sound data region 102D, the system controller 100 reads out the beep sound file for the beep, and plays back the beep sound from the speaker 128, via the voice codec 124 and the second AMP 126. In the case of the vibration operation, since the vibration pattern for the vibration pattern 5 is stored in the notification sound data region 102D, the system controller 100 reads out the vibration file for the vibration pattern 5, and vibrates the IC recorder using the vibration element 110 by means of the vibration circuit 108. Once the beep 5 has been played back or vibration generated with vibration pattern 5, the originating processing flow is returned to.

If the result of determination in step S402 is that there are not both a normal recording file and a memo recording file, it is next determined whether or not only a memo recording file exists (S406). Here, determination is based on the result of the check in step S400.

If the result of the determination in step S406 is that only a memo recording file exists, a beep 4 is played back (or in the case of a vibration operation, a vibration pattern 4 is driven) (S408). In this step, the system controller 100 reads out a beep sound file for the beep 4 from the notification sound data region 102D, and plays back the beep sound. In the case of a vibration operation, the system controller 100 reads out a vibration file for the vibration pattern 4 from the notification sound data region 102D, and vibrates the IC recorder using the vibration element 110. Once the beep 4 has been played back or vibration generated with vibration pattern 4, the originating processing flow is returned to.

If the result of determination in step S406 is not that only a memo recording file exists, it is next determined whether or not only a normal recording file exists (S410). Here, determination is based on the result of the check in step S400.

If the result of the determination in step S410 is that only a normal recording file exists, a beep 3 is played back (or in the case of a vibration operation, a vibration pattern 3 is driven) (S412). In this step, the system controller 100 reads out a beep sound file for the beep 3 from the notification sound data region 102D, and plays back the beep sound. In the case of a vibration operation, the system controller 100 reads out a vibration file for the vibration pattern 3 from the notification sound data region 102D, and vibrates the IC recorder using the vibration element 110. Once the beep 3 has been played back or vibration generated with vibration pattern 3, the originating processing flow is returned to.

If the result of determination in step S410 is not that only a normal recording file exists, the movement direction of the cursor is next determined (S414). Since the movement direction of the cursor SEG2 is detected in step S202 or S206 (refer to FIG. 3), in this step the determination is based on the detection result for step S202 or step S206.

If the result of determination in step S414 is that the movement direction of the cursor is towards a later day, playback of a beep 2 (in the case of a vibration operation drive of a vibration pattern 1) is carried out (S416). In this step, the system controller 100 reads out a beep sound file for a beep 1 from the notification sound data region 102D, and plays back the beep sound. In the case of a vibration operation, the system controller 100 reads out a vibration file for the vibration pattern 1 from the notification sound data region 102D, and vibrates the IC recorder using the vibration element 110. Once the beep 1 has been played back or vibration generated with vibration pattern 1, the originating processing flow is returned to.

On the other hand, if the result of determination in step S414 is that the movement direction of the cursor is towards an earlier day, playback of a beep 2 (in the case of a vibration operation, drive of a vibration pattern 2) is carried out (S418). In this step, the system controller 100 reads out a beep sound file for the beep 2 from the notification sound data region 102D, and plays back the beep sound. In the case of a vibration operation, the system controller 100 reads out a vibration file for the vibration pattern 2 from the notification sound data region 102D, and vibrates the IC recorder using the vibration element 110. Once the beep 2 has been played back or vibration generated with vibration pattern 2, the originating processing flow is returned to.

Figure 3:
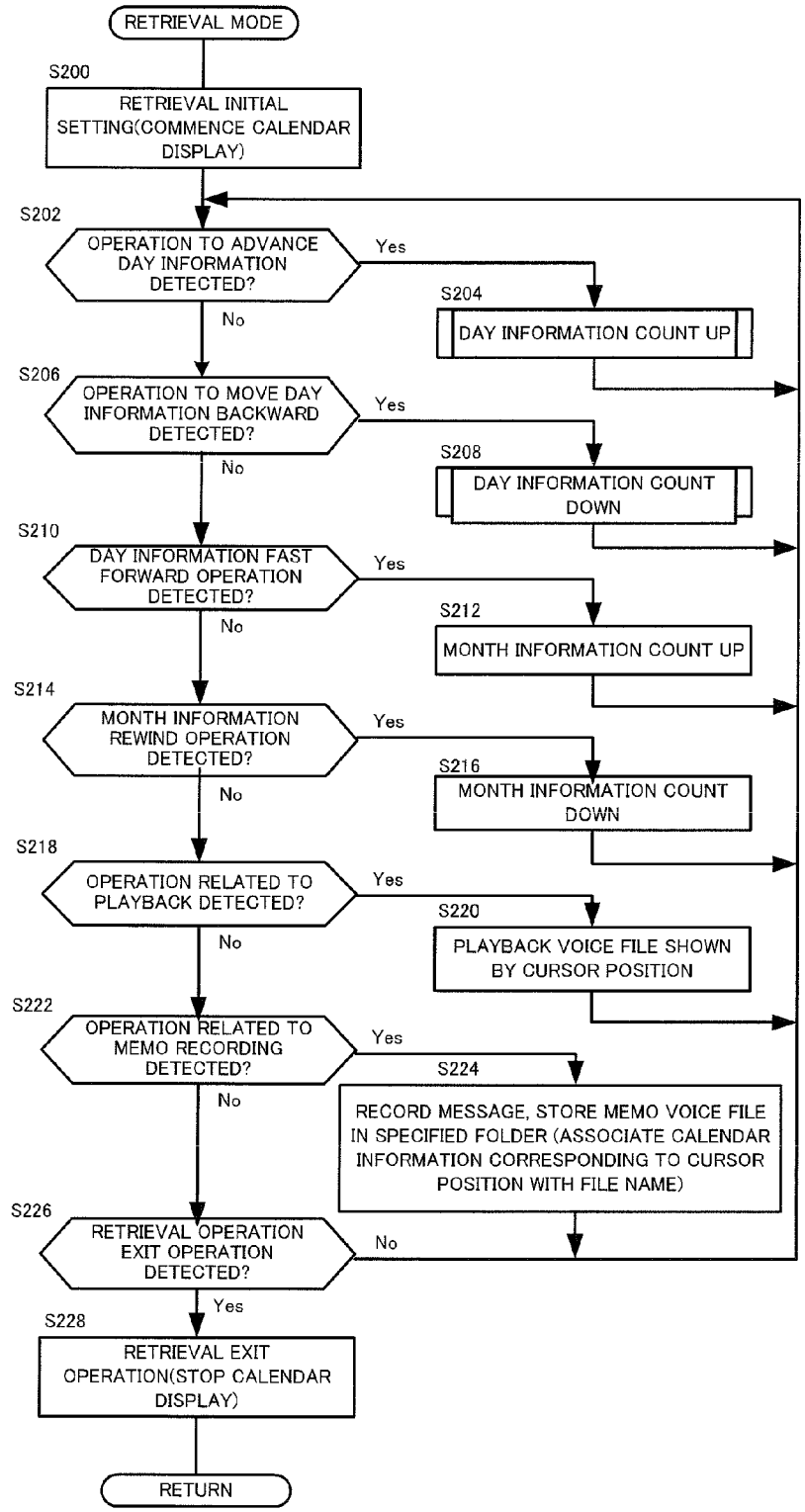
FIG. 3 is a flowchart showing retrieval mode operation of the IC recorder of the one embodiment of the present invention.
Figure 4:
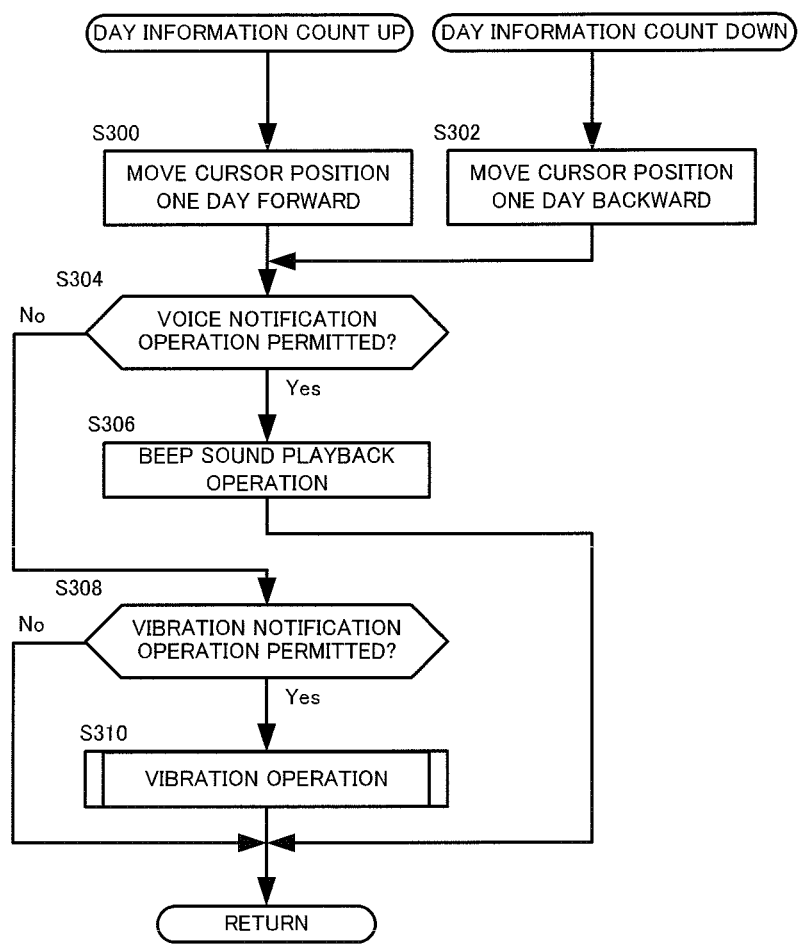
FIG. 4 is a flowchart showing operation for day information count up and day information count down for the IC recorder of the one embodiment of the present invention.
Figure 5:
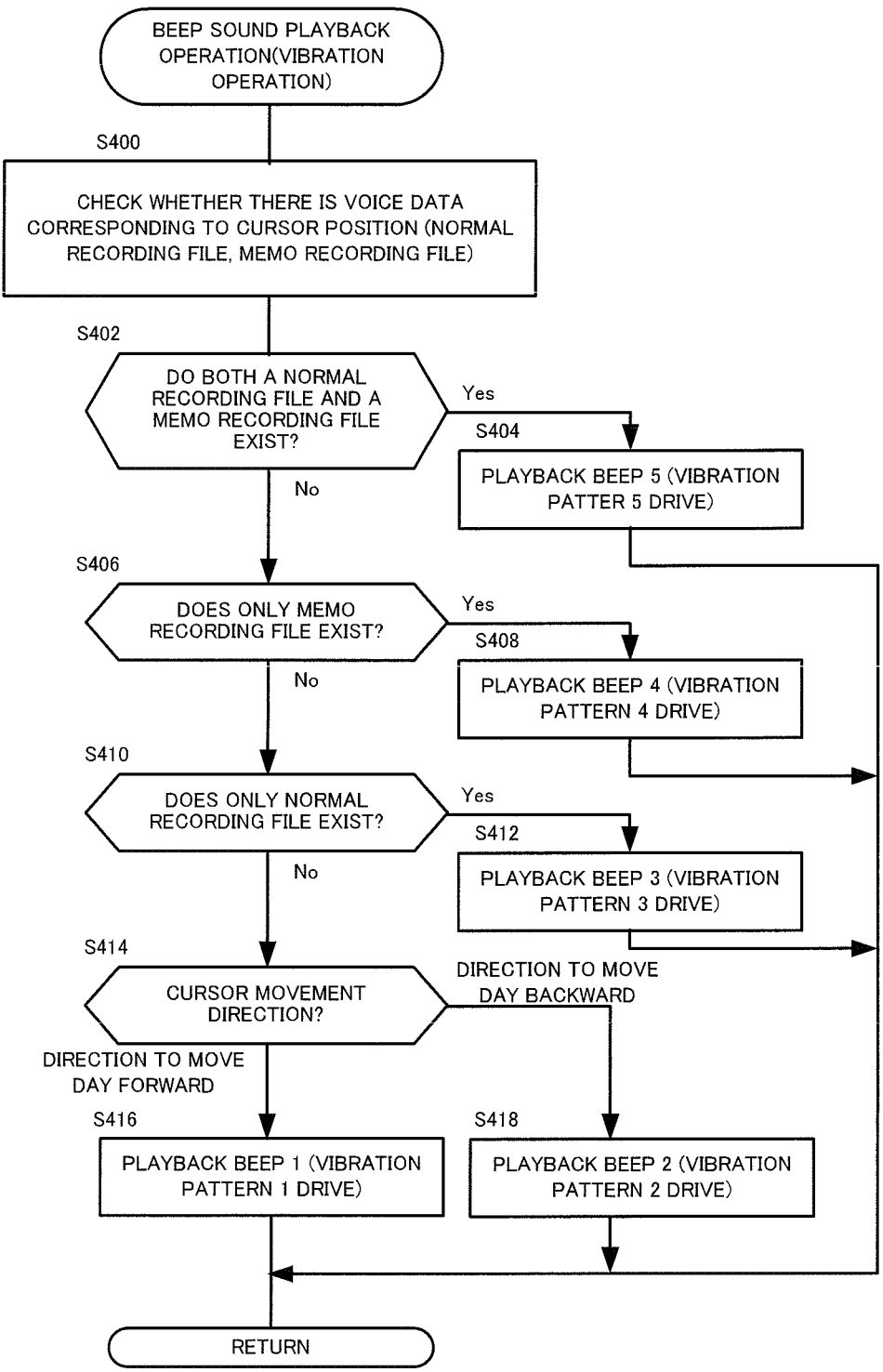
FIG. 5 is a flowchart showing beep sound playback operation of the IC recorder of the one embodiment of the present invention.

In this way, with this embodiment, if retrieval mode is set calendar display is performed (S200 in FIG. 3), and if the cursor SEG2 is moved in response to operation of the retrieval SW 112H (S202, S206 in FIG. 3), if voice data is stored at the cursor position that has been moved to, the existence of voice data is displayed for the user using a beep sound or vibrating non-visual indication (S306, S310 in FIG. 4, S404, S408, S412 in FIG. 5). As a result, it is possible to carry out voice file retrieval without looking at the display section 106, giving good usability and a high level of convenience.

Next, the beep sounds and vibration patterns of steps S404, S408, S412, S416 and S418 will be described using FIG. 7. FIG. 7 shows notification formats executed for a non visual display operation (notification operation). The voice notification operation in the previously described "beep sound playback operation" subroutine has five notification formats.

Notification format 1 and a notification format 2 relate to date information for position shown by the cursor SEG2, and represent patterns for a sound played back when neither a normal voice file or a memo recording file exist. The sound patterns differ in accordance with movement direction of the cursor SEG2 in this case. Because of the difference in sound patterns, the user can recognize the direction of cursor movement without looking at the display section 106.

Notification format 1 represents a sound pattern (beep sound 1) to be played back in the case where movement direction of the cursor SEG2 is a direction that moves the date shown by the cursor SEG2 forward. Notification format 2 represents a sound pattern (beep sound 2) to be played back in the case where movement direction of the cursor SEG2 is a direction that moves the date shown by the cursor SEG2 backwards. Data for the respective beep sounds is stored in the notification sound data region 102D of the nonvolatile memory 102 as sound files. The sound that is played back as a voice notification is not limited to a beep sound. A word that a specified person can recognize may be played back instead of the beep sound.

Notification format 3 relates to date information for position shown by the cursor SEG2, and represents a pattern for a sound pattern (beep sound 3) played back when at least one normal voice file exists and a memo recording files does not exist. Notification format 4 relates to date information for position shown by the cursor SEG2, and represents a pattern for a sound (beep sound 4) played back when a normal voice file does not exist but at least one memo recording file does exist. Notification format 5 relates to date information for position shown by the cursor SEG2, and represents a pattern for a sound (beep sound 5) played back when at least one normal voice file and at least one memo recording file exist together.

The vibration notification operation for the "vibration operation" subroutine has five notification formats. Notification format 1 and a notification format 2 relate to date information for position shown by the cursor SEG2, and represent vibration patterns set up in a vibration element when neither a normal voice file or a memo recording file exist. The vibration patterns differ in accordance with movement direction of the cursor SEG2 in this case. Because of the difference in vibration patterns, the user can recognize the direction of cursor movement without looking at the display section 106. Notification format 1 represents a pattern (vibration pattern 1) for vibration set up in a vibration element when the movement direction of the cursor is a direction to move the date shown by the cursor forward. Notification format 2 represents a pattern (vibration pattern 2) for vibration set up in a vibration element when the movement direction of the cursor is a direction to move the date shown by the cursor backward. Signals for drive patterns input to a drive circuit in order to generate the respective vibration patterns are stored in the non-volatile memory. The vibration patterns can be generated by converting frequency of a beep sound to a vibration frequency that can be perceived by a person, and driving the vibration element 110 at this vibration frequency.

Notification format 3 relates to date information for position shown by the cursor SEG2, and represents a vibration (vibration pattern 3) set up in the vibration element when at least one normal voice file exists and a memo recording file does not exist. Notification format 4 relates to date information for position shown by the cursor SEG2, and represents a vibration (vibration pattern 4) set up in the vibration element when at least one memo recording file exists and a normal voice file does not exist. Notification format 5 relates to date information for position shown by the cursor SEG2, and represents a vibration (vibration pattern 5) set up in the vibration element when at least one memo recording file exists and at least one normal voice files exists together.

In the flowcharts of FIG. 4 and FIG. 5 above, there is no description relating to carrying out both the beep sound playback operation and the vibration operation. However, the two non visual notification operations may be executed simultaneously in order to allow the user to more clearly recognize the existence of files. In this case, for example, when the beep sound playback operation of step S306 in FIG. 4 has been carried out, steps S308 and S310 may then be carried out.

As has been described above, the IC recorder of one embodiment of the present invention is capable of managing the storage of generated voice data as voice files having date information attached (refer to S112 in FIG. 2 and S224 in FIG. 3). Also, the IC recorder has a retrieval switch (SW) 112H, a display section 106 capable of calendar display, and a storage section (nonvolatile memory 102) for storing voice files. Also, the system controller 100 of the IC recorder displays a movable cursor SEG2 on a calendar display when a mode for retrieving and playing back voice files from the storage section has been selected (Yes in S102 of FIG. 2), and also retrieves voice files that have been stored in the storage section based on date information that has been attached to the files (S204 and S208 in FIG. 3, and S400 in FIG. 5), displays the retrieval result as a mark representing the existence of voice files close to day display on the calendar display (SEG3 and SEG4 in FIG. 6), moves the display position of the cursor SEG2 in units of one day every time operation of the retrieval SW 112H is detected (S300 and S302 in FIG. 4), and plays back a specified notification sound when voice files exist relating to the day display at the display position to which the cursor has been moved (S306). As a result, it is possible to carry out voice file retrieval without looking at the display section 106, giving good usability and a high level of convenience. It is also possible to retrieve voice data even in cases where the user is visually impaired.

Also, the IC recorder of one embodiment of the present invention is provided with a vibration generating section for causing vibration (vibration circuit 108, vibration element 110). Also, the system controller 100 of the IC recorder displays a movable cursor SEG2 on a calendar display when a mode for retrieving and playing back voice files from the storage section has been selected (Yes in S102 of FIG. 2), and also retrieves voice files that have been stored in the storage section based on date information that has been attached to the files (S204 and S208 in FIG. 3, and S400 in FIG. 5), displays the retrieval result as a mark representing the existence of voice files close to day display on the calendar display (SEG3 and SEG4 in FIG. 6), moves the display position of the cursor SEG2 in units of one day every time operation of the retrieval SW 112H is detected (S300 and S302 in FIG. 4), and controls the vibration generating section to set up a specified vibration when voice files exist relating to the day display at the display position to which the cursor has been moved (S306). As a result, it is possible to carry out voice file retrieval without looking at the display section 106 by using non-visual indication, giving good usability and a high level of convenience. It is also possible to retrieve voice data even in cases where the user is visually impaired.

Also, in the IC recorder of the one embodiment of the present invention, voice files include first voice files that contain date information in at least part of a file name (memo recording files that have been stored in the memo recording data region 102F), and second voice files that do not include date information in the file name (normal recording files that have been stored in a normal recording data region). The system controller 100, in the case where a voice file is the first voice file, plays back a first notification sound as the notification sound (playback of beep 4 in steps S408 in FIG. 5), while in the case where a voice file is the second voice file, plays back a second notification sound as the notification sound (playback of beep 3 in step S412 in FIG. 5). It is therefore possible to recognize a memo recording file and a normal recording file with non visual indication.

In the one embodiment of the present invention, for the non-visual indication of the existence of voice data, it is possible to select either a beep sound playback operation or a vibration operation. However, it is also possible to not have both non visual indications, and to provide any one of them.

Also, in the one embodiment of the present invention either one of the beep sound playback operation or the vibration operation are performed, but in order for the user to more clearly recognize the existence of files, the two non-visual notification operations may be executed simultaneously, as mentioned in the description for FIG. 7.

Also, in the one embodiment of the present invention there are five formats for the beep sound playback pattern and the vibration pattern, but this is arbitrary and not limiting, and it is also possible to have a different number of patterns.

Also, in the one embodiment of the present invention, description has been given for an example that uses a retrieval switch (SW) 112H as a retrieval instruction section for instructing retrieval of voice files that have been stored in the storage section on the calendar display, but this is not limiting, and it is also possible to use gesture detection for discerning gestures of a touch panel input (for example, scroll operation etc.), or non contact system etc., or to utilize voice recognition for a user to instruct a calendar date, by providing speech analysis.

Also, in the one embodiment of the present invention, a cursor as shown in FIG. 6, as an indication, is made to move in response to operation of the retrieval SW 112H, as a retrieval instructing section. However the indication is not limited to the illustrated example, and other indications may be used, such as varying the color of date sections or using another display method etc.

Also, in the one embodiment of the present invention the calendar is displayed in month units, but this is not limiting, and suitably different displays are also possible, such as units of a week or units of a number of few months. Displaying time zone units is also possible. In this case, voice file retrieval is carried out for every time zone.

The object of the present invention may also be accomplished by supplying storage media, in which software programs for implementing functions disclosed in the embodiment are stored, to a device, and having a control section of the device (computer, microcontroller, micro processor, CPU, MPU etc.) read out and execute program code that is stored in the storage media. Specifically, program code itself that has been read out from storage media implements functions of the embodiment, and storage media storing the program code constitutes the present invention.

Not only are the functions disclosed in the embodiment implemented by the control section executing only program code that has been read out. That program code may also utilize some processing functions possessed by an operating system (OS) installed in the control section of the device. Also, the control section for executing program code that has been read out from the storage media is not limited to a single control section. It is also possible to connect a plurality of control sections that exist within the device, and execute the program code with these control sections acting cooperatively. Alternatively, it is also possible to connect the device and peripheral devices, to connect control sections that exist in the device and the peripheral devices, and execute the program code with these control sections acting cooperatively.

The program code may also be stored in a storage medium or storage section, and the manner of storing the programs in the storage medium or storage section may be to store at the time of manufacture, or by using a distributed storage medium, or they be downloaded via the Internet.

Also, with the one embodiment of the present invention, as a voice recording and playback device an example applied to an IC recorder has been shown, but the present invention may also be applied to electronic devices other than an IC recorder, such as a mobile phone, a multifunctional mobile terminal (smart phone) etc.

Also, regarding the operation flow in the patent claims, the specification and the drawings, for the sake of convenience description has been given using words representing sequence, such as "first" and "next", but at places where it is not particularly described, this does not mean that implementation must be in this order.

The present invention is not limited to these embodiments, and structural elements may be modified in actual implementation within the scope of the gist of the embodiments. It is also possible form various inventions by suitably combining the plurality structural elements disclosed in the above described embodiments. For example, it is possible to omit some of the structural elements shown in the embodiments. It is also possible to suitably combine structural elements from different embodiments.

What is claimed is:

1. A voice recording and playback device that is capable of storage management of generated voice data, to which date information has been attached, as voice files, comprising:
    a storage section for storing the voice files;
    a display section capable of calendar display;
    a retrieval instruction section for instructing retrieval of voice files that have been stored in the storage section from the calendar; and
    a control section for, at the time of retrieving voice files from the storage section, performing movable identification on the calendar display, as well as retrieving voice files that have been stored in the storage section based on date information attached to the files, and performing display of results of this retrieval indicating the existence of voice files close to day display on the calendar display, wherein:
    the control section moves the identification position based on an instruction operation by the retrieval instruction section, and generates a notification in accordance with voice files that exist on the date of the identification position that has been moved;
    the voice files include (1) at least one voice file of a first type that contains date information in at least part of a file name, and (2) at least one voice file of a second type that does not contain date information in the file name; and
    the control section carries out retrieval based on date information contained in a file name and generates a first type of notification as the notification when a voice file of the first type is acquired, and carries out retrieval based on date information contained in the file attribute information and generates a second type of notification, which is different from the first type of notification, as the notification when a voice file of the second type is acquired.

2. The voice recording and playback device of claim 1, further comprising:
    a notification sound generating section, wherein
    the control section carries out control of the notification sound generating section to generate notifications indicating the presence or absence of the voice files as different notification sounds.

3. The voice recording and playback device of claim 1, further comprising:
    a vibration generating section for causing vibration, wherein
    the control section carries out control of the vibration generating section to generate vibration indicating the presence or absence of the voice files.

4. The voice recording and playback device of claim 3, wherein:
    the control section generates vibration of a first pattern from the vibration generating section in the event that the voice file is a voice file of the first type, and generates vibration of a second pattern, which is different from the first pattern, from the vibration generating section in the event that the voice file is a voice file of the second type.

5. A control method, for a voice recording and playback device, that is capable of managing storage of generated voice data as voice files to which date information has been attached, and that comprises a storage section for storing the voice files, a display section capable of calendar display, and a retrieval instructions section for instructing retrieval of voice files that have been stored in the storage section from the calendar, comprising:
    a display step of, at the time of retrieving voice files from the storage section, performing movable identification on the calendar display, as well as retrieving voice files that have been stored in the storage section based on date information attached to the files, and performing display of results of this retrieval indicating the existence of voice files close to day display on the calendar display; and
    a notification step of moving the identification position based on an instruction operation by the retrieval instruction section, and generating a notification in accordance with voice files that exist on the date of the identification position that has been moved, wherein
    the voice files include (1) at least one voice file of a first type that contains date information in at least part of a file name, and (2) at least one voice file of a second type that does not contain date information in the file name; and
    the notification step carries out retrieval based on date information contained in a file name and generates a first type of notification as the notification when a voice file of the first type is acquired, and carries out retrieval based on date information contained in file attribute information and generates a second type of notification, which is different from the first type of notification, as the notification when a voice file of the second type is acquired.

6. A non-transitory computer-readable medium storing a computer program for a control method, for a voice recording and playback device, that is capable of managing storage of generated voice data as voice files to which date information has been attached, and that comprises a storage section for storing the voice files, a display section capable of calendar display, and a retrieval instructions section for instructing retrieval of voice files that have been stored in the storage section from the calendar, comprising:
    a display step of, at the time of retrieving voice files from the storage section, performing movable identification on the calendar display, as well as retrieving voice files that have been stored in the storage section based on date information attached to the files, and performing display of results of this retrieval indicating the existence of voice files close to day display on the calendar display; and a notification step of moving the identification position based on an instruction operation by the retrieval instruction section, and generating a notification in accordance with voice files that exist on the date of the identification position that has been moved, wherein the voice files include (1) at least one voice file of a first type that contains date information in at least part of a file name, and (2) at least one voice file of a second type that does not contain date information in the file name; and the notification step carries out retrieval based on date information contained in a file name and generates a first type of notification as the notification when a voice file of the first type is acquired, and carries out retrieval based on date information contained in file attribute information and generates a second type of notification, which is different from the first type of notification, as the notification when a voice file of the second type is acquired.

* * * * *